United States Patent
Meir

(10) Patent No.: US 9,976,710 B2
(45) Date of Patent: May 22, 2018

(54) FLEXIBLE STRIP LIGHTING APPARATUS AND METHODS

(71) Applicant: Lilibrand LLC, Brooklyn, NY (US)

(72) Inventor: Ariel Meir, Brooklyn, NY (US)

(73) Assignee: LiliBrand LLC, Brooklyn, NY (US)

( * ) Notice: Subject to any disclaimer, the term of this patent is extended or adjusted under 35 U.S.C. 154(b) by 108 days.

(21) Appl. No.: 14/523,392

(22) Filed: Oct. 24, 2014

(65) Prior Publication Data
US 2015/0117022 A1    Apr. 30, 2015

Related U.S. Application Data

(60) Provisional application No. 61/897,448, filed on Oct. 30, 2013.

(51) Int. Cl.
| | |
|---|---|
| *F21S 4/00* | (2016.01) |
| *F21S 4/22* | (2016.01) |
| *H05K 3/36* | (2006.01) |
| *H05K 3/30* | (2006.01) |
| *H05K 1/14* | (2006.01) |
| *H05K 3/28* | (2006.01) |
| *F21Y 115/10* | (2016.01) |

(52) U.S. Cl.
CPC ........... *F21S 4/22* (2016.01); *H05K 3/285* (2013.01); *H05K 3/30* (2013.01); *H05K 3/361* (2013.01); *F21Y 2115/10* (2016.08); *H05K 1/142* (2013.01); *H05K 3/284* (2013.01); *H05K 2201/0133* (2013.01); *H05K 2201/10106* (2013.01); *H05K 2203/1305* (2013.01); *Y10T 29/49126* (2015.01)

(58) Field of Classification Search
CPC ............................................. F21S 4/22–4/26
USPC ............................................................ 362/84
See application file for complete search history.

(56) References Cited

U.S. PATENT DOCUMENTS

| | | |
|---|---|---|
| 5,821,695 A | 10/1998 | Vilanilam et al. |
| 6,354,714 B1 | 3/2002 | Rhodes |
| 6,590,235 B2 | 7/2003 | Carey et al. |
| 7,595,113 B2 | 9/2009 | Miyoshi |
| 7,700,965 B2 | 4/2010 | Chang |
| 8,076,683 B2 | 12/2011 | Xu |
| 8,314,566 B2 | 11/2012 | Steele et al. |
| 8,575,646 B1 | 11/2013 | Shum |
| 8,748,202 B2 | 6/2014 | Kwon et al. |

(Continued)

FOREIGN PATENT DOCUMENTS

| | | |
|---|---|---|
| CN | 101592291 | 12/2009 |
| CN | 201590432 | 9/2010 |

(Continued)

OTHER PUBLICATIONS

The International Searching Authority, Notification of Transmittal of the international Search Report and the Written Opinion of the International Searching Authority or the Declaration, dated Jan. 22, 2015.

*Primary Examiner* — Sean Gramling
(74) *Attorney, Agent, or Firm* — Wolf, Greenfield & Sacks, P.C.

(57) ABSTRACT

The present invention is directed to the use of light emitting diode (LED) lighting in flexible strips, where the color of the lighting emitted from the flexible strip is consequential to the encapsulation process and heat from the lights is adequately dissipated.

19 Claims, 4 Drawing Sheets

(56) References Cited

U.S. PATENT DOCUMENTS

| | | | |
|---|---|---|---|
| 8,791,485 B2 | 7/2014 | Ohbayashi et al. | |
| 2003/0198049 A1* | 10/2003 | Hulse | G02B 6/001 362/249.01 |
| 2005/0280016 A1 | 12/2005 | Mok et al. | |
| 2006/0134440 A1 | 6/2006 | Crivello | |
| 2007/0092736 A1 | 4/2007 | Boardman et al. | |
| 2007/0103902 A1 | 5/2007 | Hsiao | |
| 2008/0144322 A1 | 6/2008 | Norfidathul et al. | |
| 2009/0272996 A1 | 11/2009 | Chakraborty | |
| 2009/0321766 A1 | 12/2009 | Chang | |
| 2010/0008090 A1* | 1/2010 | Li | F21V 17/007 362/249.03 |
| 2011/0198067 A1 | 8/2011 | Hada et al. | |
| 2013/0063939 A1 | 3/2013 | Kondo et al. | |
| 2013/0214691 A1 | 8/2013 | Chen | |
| 2014/0036500 A1 | 2/2014 | Eggleton et al. | |
| 2014/0177262 A1 | 6/2014 | Lai | |
| 2014/0334142 A1* | 11/2014 | Levante | F21S 4/005 362/222 |
| 2015/0117022 A1 | 4/2015 | Meir | |
| 2015/0316219 A1* | 11/2015 | Mallory | F21K 9/56 362/326 |

FOREIGN PATENT DOCUMENTS

| | | |
|---|---|---|
| CN | 101997074 | 3/2011 |
| EP | 0592746 B1 | 3/1997 |
| EP | 2474775 B1 | 11/2013 |
| EP | 2256833 B1 | 4/2014 |
| EP | 2484956 B1 | 6/2014 |
| KR | 1020110106033 | 6/2013 |
| WO | 2014082262 A1 | 6/2014 |

* cited by examiner

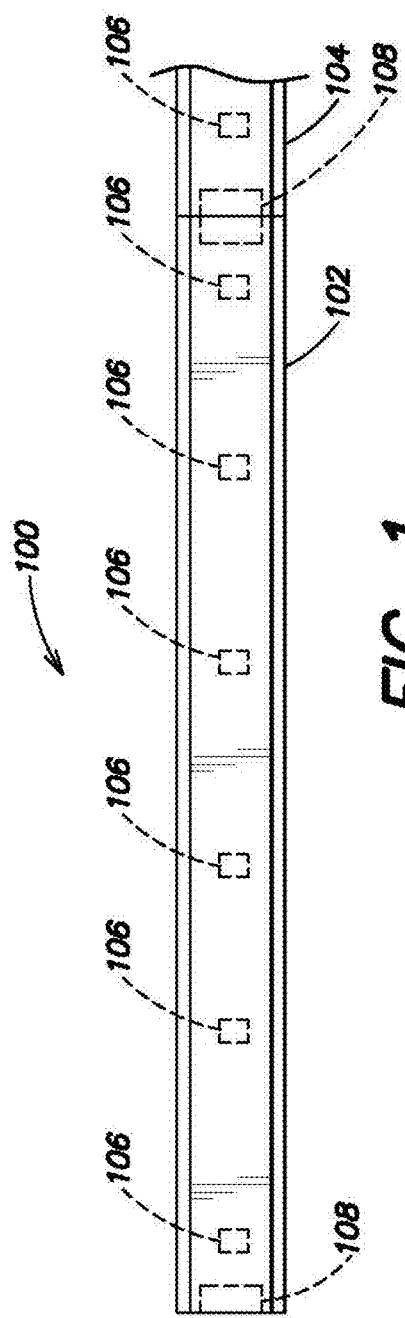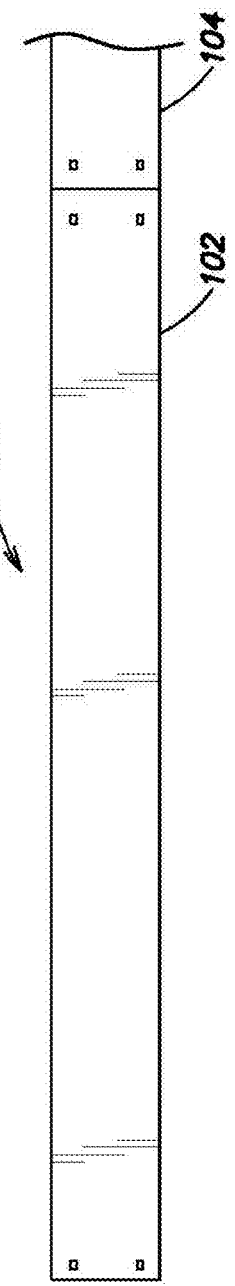

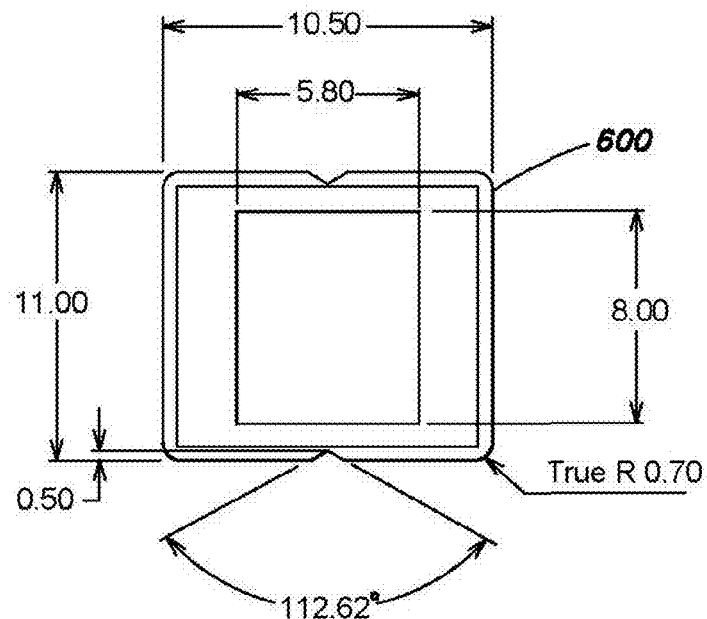
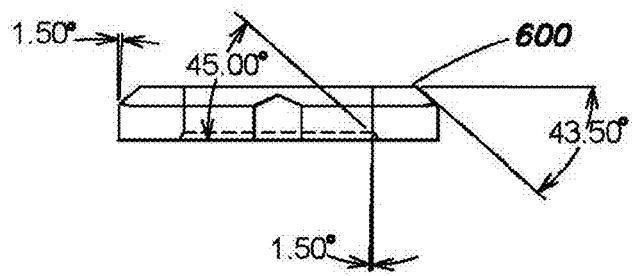
FIG. 6
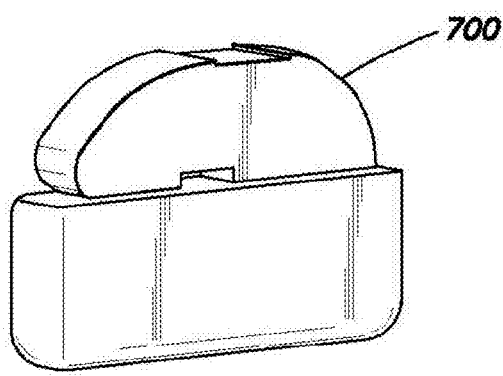
FIG. 7

FLEXIBLE STRIP LIGHTING APPARATUS AND METHODS

The present application claims priority to U.S. Provisional Patent Application No. 61/897,448, filed on Oct. 30, 2013, and incorporated herein by reference.

BACKGROUND OF THE PRESENT INVENTION

Certain types of lighting emit light, such as white light, in a particular color temperature. White light may be characterized in terms of temperature. Color temperatures over 5,000K are considered cool colors, meaning they emit light in a bluish-white range, whereas lower color temperatures (typically 2,200-3,000K) are considered warm colors (emitting light in a yellowish white through red range). Currently with LEDs, if the color goes below 2,700K, the emitted light is amber, which does not provide for the preferred color in typical residential and commercial applications. At present there is a desire to emit light in the warm range with LEDs which themselves emit light at below 2,700K.

In addition, the present invention is directed to meeting a desire to have light emitted preferably by LEDs encased in flexible strips. Such flexible strip lighting can be used in a variety of applications, such as but not limited to commercial displays, under cabinets, cove/soffit, and for safety purposes (such as aisle lighting). Flexible strips permit easy installation and avoid the need to deal with stringing and interconnecting the lights and the flexible strips allow such interconnection to be in place in advance, freeing the installer (or de-installer) to lay strips instead of individual lights.

This strip lighting is particularly desirable in commercial settings, where lights are installed and uninstalled frequently, particularly in displays which have short installation durations and the need to install is under time pressures.

In many of these circumstances, the color of the light is particularly important. For example, under cabinet lighting in certain commercial environments needs to be bright white, whereas cove/soffit lighting might need to be warmer color temperatures. Such flexible strips can potentially satisfy these color and installation needs, so long as the color of the LEDs can be adjusted from flexible strip to flexible strip in the production process.

Currently the main and only way to effect color temperature of LEDs is either via phosphor directly placed on the LED chip or via remote phosphor layers that are used as lenses over blue LEDs. Such a device may not be cost effective to manufacture. Another issue with the remote phosphor is aesthetics; when the light is off, it appears bright yellow or orange depending on the color temperature of the fixture.

Prior to the present invention, the use of LED flexible strips has been limited to the color temperature offered by the LED chip and incorporating remote phosphor solutions is both impractical mechanically speaking as well as cost prohibitive. The costs accrue from manufacture of the strips, the costs associated with the need to dissipate heat from the strips, and the costs to assemble and install the strips. In short, the present invention includes a novel approach so as to make the assembly of such devices more readily usable and economic in commercial environments.

BRIEF DESCRIPTION OF THE PRESENT INVENTION

The present invention is directed to the use of light emitting diode (LED) lighting and particularly to the use of lights in flexible strips, where the color of the lighting emitted from the flexible strip is consequential to the encapsulation process and heat from the lights is adequately dissipated. Although the present invention is primarily focused on flexible linear LED lighting, it is also applicable to other LED lighting formats, such as but not limited to low voltage lighting and other such lighting and in other non-linear or non-flexible strips. The present invention is further directed to connectorization of the strips (or other form of encapsulated lights) and to a cutting tool for sizing strips for installation.

BRIEF DESCRIPTION OF THE FIGURES

FIG. 1 displays a top-down view of an encapsulated LED strip.

FIG. 2 depicts the strip of FIG. 1 in a bottom-up view.

FIG. 6 depicts a view of the connector bracket of the present invention.

FIG. 7 depicts a rendering of the cutting tool of the present invention.

DESCRIPTION OF THE PRESENT INVENTION

Figure 3:
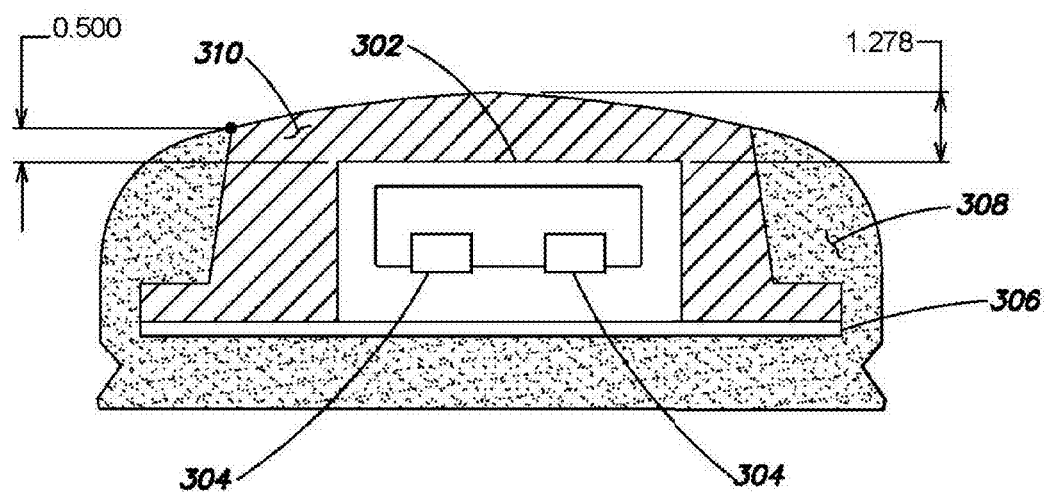
FIG. 3 depicts one view of the connector of the present invention.

The present invention is directed to various attributes of product and method of producing product, including attributes of flexible linear LED lighting, where those attributes include placing LEDs on flexible PCB, adjusting the color emitted through the an elastomeric encapsulation that encapsulates the LEDs, dissipating heat of the encapsulated LEDs and circuitry, connectorizing the encapsulated strips, and a tool for cutting the light-emitting strips. One objective is to mimic the warmth of the traditional incandescent lamp using LEDs of other wavelengths and/or emitting at lower power. Another objective is to use higher intensity LEDs and dissipate heat more effectively than in prior designs.

Color Adjustment

The present invention includes a new method to adjust the color, color temperature, color rendering index (CRI) and the different R factors that influence the color rendering of the projected light. This is achieved in part by using combinations of various silicone dyes (preferably non-phosphor based). This is a cost effective and more aesthetically pleasing solution than prior solutions, particularly when the fixture/light source is visible to the end user.

With regard to adjusting the R factors, the present invention permits adjustment of the R factor from R1-R8 (color rendering index or CRI values) as well as R9-R14 values. CRI is an industry rating system that measures the accuracy of how well a light source reproduces the color of an illuminated object. Test colors R1-R8 are pastel-like and R9+ are more vivid.

The present invention is further directed, in part, to pigmentation of an elastomer. Such elastomers may be any of silicones, polyurethanes, thermoplastics such as poly (methyl methacrylate) ("PMMA") or another similar elastomer (referred to herein collectively as "silicone"). The silicone pigmentation results in an apparent clear strip, but with the ability to change the color of the emitted light of the encapsulated LEDs (or other light source) to a more desirable color. The pigmentation element may be added in various concentrations comprising one or more pigments (such as but not limited to yellow, red, or brown), which are distributed uniformly through the silicone. The lights themselves are also distributed, typically uniformly, and encapsulated in the silicone, together with a printed circuit board (PCB) and end connectors. The result is a flexible strip with embedded LEDs which emits light at a color temperature different from the actual LED's color temperature. The strips are attachable to one another.

The preferred pigments used are SILc pig silicone based, although alternate pigments may be used so long as the pigments distribute uniformly in silicone.

For example, the present invention can use 2,700K LEDs and produce product that emits light at a discrete, predetermined point within an 1,800K-5,000K temperature range. In this example, the basic formula is a 1:20 ratio between red and yellow, and the ratio is adjusted in varying concentrations to achieve different values in the range noted above. The more concentrated, the closer the color is to 2,200K. For a bottom end of the range (2,200K-2,400K), brown pigment may be added to the red and yellow mixture above at 1:20 ratio. In the preferred embodiment, once the pigmentation is added to the silicone, the composition is maintained in a liquid form in a linear mold, with lights and PCB laid in the silicone as desired, and the silicone with pigmentation is allowed to harden. The mixtures noted above are mixed into the silicone and dispensed over the LED strip that is sitting inside a silicone tray. This process fully encapsulates the LEDs.

Note that the process may result in various shades and colors, depending upon the pigments and quantities used. Lights can appear white, yellow, red, and green, among others.

In another example, the LEDs (or other lights) can be inserted with lensing to direct the lighting if desired.

Encapsulation

The present invention is also directed to encapsulating LED lighting in a flexible strip. FIG. 1 shows a top-down view of the encapsulated silicone strip 100 of the present invention, including the pre-selected LEDs 106. FIG. 2 shows a bottom-up view. These views show a complete first strip 102 attached to a second strip 104 and, particularly, the two strips 102 and 104 are commonly encapsulated.

In the preferred embodiment of the present invention Sorta clear 40 is used as the encapsulating silicone, which is a platinum, or "addition", cured silicone. Alternatively, tin, or "condensation", cured silicone may be used. Platinum-cured is preferred because it is longer lasting without becoming brittle, does not shrink and is more durable in various environmental conditions, such as changes in temperature or in the presence of other chemicals.

In the present invention, strips of LED-mounted PCBs ("boards") are attached to one another to form a potentially lengthy chain and may be commonly or separately encapsulated in silicone (or some other comparable encapsulator which allows for light from LEDs to filter through). Each strip 102 and 104 is nominally six inches long, although the length of a strip may vary based on application of use. Each strip 102 and 104 is preferably the same length (other than end strips, which may be cut to fit), although different length strips may alternatively be used.

Figure 4:
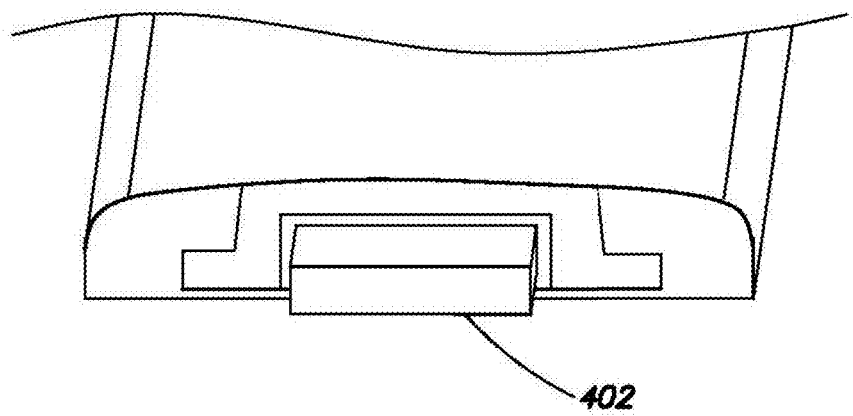
FIG. 4 depicts an alternate view of the connector of the present invention.
Figure 5:
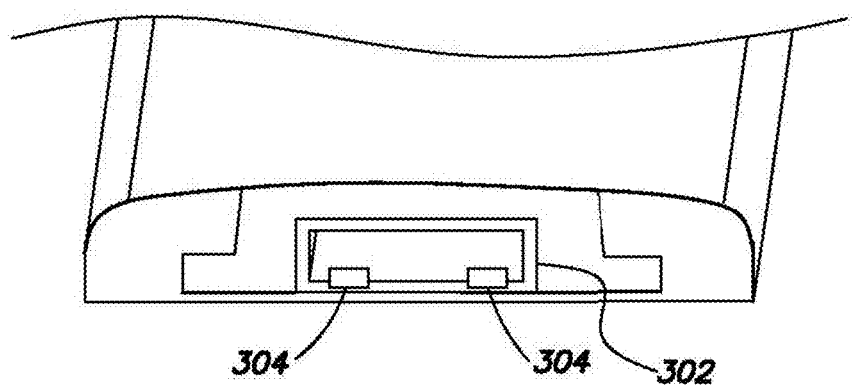
FIG. 5 depicts yet another alternate view of the connector of the present invention.

At each end of the strip, or at regular intervals in the strip, connectors 108 are used for connecting sections or strips. FIGS. 3-5 show views of the preferred embodiment of the physical connector of the present invention. A connector 302 at one end mates with a connector 402 at the end of the adjoining strip. A PCB 306 is embedded within a strip, and runs from connector to connector. That is, a connector attaches to each end of the PCB 306, all encapsulated within a strip, other than the exposed ends of the connectors.

The net result is a linear LED strip encompassing color-changing characteristics for internal lighting.

PCBs

In the preferred embodiment, a PCB runs the length of the strip. Like the strip, the PCB is flexible. Each PCB has an upper surface and a lower surface. LEDs are mounted on the upper surface, preferably at equally spaced intervals. Also, other electrical elements, such as but not limited to a resistor and a current regulator, are also mounted along the PCB.

FIG. 3 shows a cross-section cut of the encapsulated silicone strip 100 of the present invention, including lighting and connector.

The PCB 306 has two layers/levels. Each consists of at least two traces 304 used to run 24 VDC through the fixture. One layer is the general one that goes through an entire potentially 22 foot run (44 boards in total) and the top layer is used for distributing the power for each individual circuit (every 6 inch board with 6 LEDs, 1 resistor and 1 current regulator). As opposed to present solutions, which only utilize the 'real estate' covered by the footprint of the LED and its immediate surrounding portion of the PCB 306 for cooling, the present invention utilizes the entirety of the PCB traces 304 to dissipate heat. In other words, the present invention, utilizes the copper that runs through the length of the PCB 306 to dissipate the heat.

The PCB 306 itself is made of FR4 material (fiberglass composite with an epoxy resin binder) sandwiched by two layers of copper.

Following mounting of the elements, including connectors, the flexible PCB 306 is encapsulated in silicone.

Importantly, in other embodiments, the strip need not be linear or flexible but could take various other shapes or forms. For example, a partially circular strip might be beneficial for some applications. In addition, the hardness of the silicone can vary by introducing quantities of a hardening agent to the silicone.

Encapsulation is accomplished by placing the PCB 306 in a silicone channel/extrusion 308 and the channel is filled with silicone 310. Once cured, the PCB 306 adheres to the silicone material that makes up the channel and thereby fully encapsulates the PCB 306.

Heat Dissipation

In addition to encapsulating the lights and changing color, the present invention addresses the need to dissipate heat from the encapsulated lights. In the preferred embodiment, heat dissipation is achieved both through properties of the encapsulating silicone as well as through the internal PCBs, although in other embodiments, one or the other might be used alone.

In the preferred embodiment, the silicone is formed of two distinct layers where one layer, in this embodiment the lower layer, allows for improved heat dissipation and the upper layer and sides may not. In this embodiment, the silicone used in the lower portion might be more porous or might have improved heat dissipating qualities and, consequently, the silicone-based material in the upper portion might be somewhat different than that of the lower portion. Also, by having two different types of silicone serving to sandwich an LED flexible strip, manufacture can be simpler. That is, the lower portion may be extruded, the LED flexible strip laid on top, and the upper portion formed thereafter and formed to adhere to the lower portion.

A further advantage of use of heat dissipative silicone is to safely encapsulate higher wattage/output products while managing the heat dissipation. That is, because heat may be dissipated through the design, higher watt and therefore more intense lighting can be used. The heat dissipation ability needs to be matched to the embedded wattage.

Alternatively, to achieve this goal, the silicone used may include heat dissipative properties, either in the silicone itself, how the silicone is hardened, or the addition of added materials in the silicone composition. In the preferred embodiment, the silicone itself provides for dissipation of heat through the bottom portion.

Alternatively, the heat dissipative material is incorporated in the base of the LED circuitry, which is also fully encapsulated in silicone. In the preferred embodiment, the PCB and, more particularly, the copper in the PCB is used for heat dissipative purposes, and both sides of the PCB are utilized.

Because of the unique nature of the material—silicone plus one or more pigments and heat dissipative capability—the co-extruding and assembly processes are unique as is the application of use. The extruding process is unique in lighting because the process requires two different extrusion materials to be coextruded and bonded, so that at the end of the extrusion process the result is one piece made up of 2 bonded materials.

Connectorization

The usual way of connecting flexible strips in installations involves soldering wires together. Such an approach is labor intensive and expensive. While AVX connectors have been used for connecting strips of LED lighting, the present invention makes use of them on a flex board. That is, the connectors are mounted on a flexible board to facilitate better electrical connectivity than in previous designs. FIGS. 4 and 5 show the male connector 402 and female connector 302, respectively, of the invention. Further, the connectors 302 and 402 may be connected to one another and encapsulated.

For such use, the present invention includes a new and improved bracket (made of high density polyethylene, or HDPE) which provides a benefit of preventing board to board disconnect. That is, the flexible strips may be extruded in defined lengths and, in implementation, may be connected electrically with AVX connectors, and help in place more securely mechanically using the aforementioned bracket. The brackets are physically connected to the end connectors and form a solid connection between flexible strips. The need for this bracket arises due to the flexible nature of our product and the fashion it is handled in the field. These connectors are designed to be used on rigid and none accessible circuitry. We are using them in a very different method. See FIG. 6 for a detailed drawing of the connector bracket 600 of the present invention, including nominal dimensions. As shown, the connector bracket 600 is a rectangular bracket that is 10.5 millimeters by 11 millimeters in size, has a cutout in the center of the bracket that is 5.8 millimeters by 8 millimeters in size, has corners with a radius of 0.7 millimeters, and a triangular cutout along the top and bottom sides of the bracket that are 0.5 millimeters deep. Of course, dimensions may vary based on application.

Cutting Tool

In addition, because lengths of use vary, it is important to easily and rapidly cut lengths of the flexible stripping so as to conform to the needs of the implementation. As a result, the present invention includes a new and improved cutting tool to allow for quick and easy disconnect at any given connector point on the LED flexible strip. This cutting tool facilitates easy cutting in the field to desired lengths (based on strips nominally being six inch increments) as well as preparing either end of the cut lengths to be reconnected to an extension/jumper cable. The tool of the present invention is a hinged cutting tool made of HDPE and includes a cutting template (using metal blades) to match the connectors on the PCB.

The tool of the present invention also has an additional purpose of scoring the silicone layer above the connector itself to allow for easy removal. This scoring is needed to allow a good mechanical connection with the locking mechanism of the connectors on any given end of an extension cable. See FIG. 7 for a cutting tool 700 for reference.

The invention claimed is:

1. An apparatus for strip lighting comprising:
   a first printed circuit board (PCB) formed as a linear strip,
   a second PCB formed as a linear strip,
   a plurality of light emitting diodes (LEDs) mounted on one side of the first and second PCBs,
   a matable connecting device comprising a first connector mounted on the first PCB and a second connector mounted on the second PCB that is different from the first connector,
   a bracket configured to secure the first connector to the second connector, and
   a pigmented elastomer commonly encapsulating the first and second PCBs including the matable connecting device and the bracket;
   wherein a pigment in said pigmented elastomer alters at least one of the color and R factor of the visible light emitted from said LEDs.

2. The apparatus of claim 1 wherein at least one pigment used in said pigmented elastomer is introduced to said elastomer as a dye.

3. The apparatus of claim 1 wherein said apparatus for strip lighting is surface mountable.

4. The apparatus of claim 1 wherein said elastomer is absent of silicone.

5. The apparatus of claim 1 wherein said LEDs are rated in the 1,800-5,000K color range.

6. The apparatus of claim 1 wherein said elastomer is distributed so as to allow for comparatively greater heat dissipation from one side than the other.

7. The apparatus of claim 1 wherein said heat dissipative capability of the elastomer on one side of said first and second PCBs is distinct from heat dissipative capabilities of the elastomer used on the other side of said first and second PCBs.

8. The apparatus of claim 1 wherein said first and second PCBs are flexible.

9. The apparatus of claim 1 wherein the first connector is a male connector and the second connector is a female connector configured to receive the male connector.

10. The apparatus of claim 9 further comprising a cutting tool comprising a hinge and a cutting template configured to match the matable connecting device.

11. A method for formulating strip lighting comprising the steps of:
   formulating a plurality of printed circuit boards (PCBs) comprising a first PCB and a second PCB, each in the form of a strip;
   mounting a plurality of LED devices on one side of each of the first and second PCBs;
   mounting a first connector on the first PCB;
   mounting a second connector on the second PCB that is different from the first connector;
   coupling the first PCB to the second PCB at least in part by attaching the first connector to the second connector and securing the first connector to the second connector using a retaining bracket; and commonly encapsulating the first and second PCBs including the first connector, the second connector, and the retaining bracket in pigmented silicone comprising a pigment.

12. The method of claim 11 wherein said elastomer comprises a plurality of parallel layers with differing heat dissipation properties in at least two layers.

13. The method of claim 12 wherein said elastomer in at least one of said parallel layers includes an improvement in the ability to dissipate heat from said printed circuit board over that of at least one other layer.

14. The method of claim 13 wherein said layer with the improved heat dissipative properties is in a layer away from the mounted LEDs.

15. The method of claim 11 wherein at least one pigment used in said pigmented elastomer is introduced to said elastomer as a dye.

16. The method of claim 11 wherein said lighting apparatus is surface mountable.

17. The method of claim 11 wherein said elastomer is absent any silicone.

18. The method of claim 11 wherein said encapsulating is such that the resulting device has greater heat dissipation from one side than the other.

19. The method of claim 11 wherein the first and second PCBs are flexible.

* * * * *